United States Patent
Tu et al.

(10) Patent No.: US 6,280,794 B1
(45) Date of Patent: Aug. 28, 2001

(54) METHOD OF FORMING DIELECTRIC MATERIAL SUITABLE FOR MICROELECTRONIC CIRCUITS

(75) Inventors: King-Ning Tu, Los Angeles; Yuhuan Xu, Santa Monica; Bin Zhao, Irvine, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/432,046

(22) Filed: Nov. 1, 1999

Related U.S. Application Data
(60) Provisional application No. 60/123,554, filed on Mar. 10, 1999.

(51) Int. Cl.$^7$ .............................. B05D 5/12; B05D 3/02
(52) U.S. Cl. .................. 427/379; 427/96; 427/372.2; 427/385.5; 438/409; 438/781; 438/960; 264/41
(58) Field of Search .................... 427/96, 372.2, 427/379, 385.5; 438/409, 411, 421, 619, 781, 960; 264/41

(56) References Cited

U.S. PATENT DOCUMENTS
5,103,288 * 4/1992 Sakamoto et al. ............. 357/71
5,668,398 * 9/1997 Havemann et al. ............. 257/522

FOREIGN PATENT DOCUMENTS
92804 * 4/1998 (JP) .

OTHER PUBLICATIONS

"Low k, Porous Methyl Silsesquioxane and Spin–On0Glass", Abbe T. Kohl, Richard Mimna, Robert Shick, Larry Rhodes, Z.L. Wang, and Paul A. Kohl, Electrochemical and Solid–State Letters, 2(2) 77–79 (1999), No month available.

Polyimide Nanofoams for Low Dielectric Applications, K.R. Carter et al. Mat. Res. Soc. Symp. Proc. vol. 381 pp. 79–91, 1995, No month available.

"Recent Advances in Low K Polymeric Materials", K.R. Carter, Mat. Res. Soc. Symp. Proc. vol. 476, pp. 87–97 (1997), No month available.

Dielectric Property and Microstructure of a Porous Polymer Material with Ultralow Dielectric Constant; Yuhuan Xu, et al. American Institute of Physics 1999, No month available.

Templating Nanopores Into Poly (Methylsilsequioxane): New Low–Dielectric Coating Suitable for Microelectronic Applications; Julius F. Remenar et al; Mat. Res. Soc. Symp. Proc. vol. 511 p. 69–75 (1998), No month available.

Damascene Integration of Copper and Ultra–Low–k Xerogel for High Performance Interconnects, E.M. Zielinski et al., No date available.

* cited by examiner

Primary Examiner—Brian K. Talbot
(74) Attorney, Agent, or Firm—Snell & Wilmer, LLP

(57) ABSTRACT

An improved dielectric material having pores formed therein and a method for forming the material are disclosed. The material is formed of a polymer. Pores within the polymer are formed by forming solid organic particles within the polymer and eventually vaporizing the particles to form pores within the polymer.

20 Claims, 2 Drawing Sheets

METHOD OF FORMING DIELECTRIC MATERIAL SUITABLE FOR MICROELECTRONIC CIRCUITS

RELATED APPLICATIONS

This application claims the benefit of pending Provisional Application Serial Number 60/123,554, filed Mar. 10, 1999.

FIELD OF THE INVENTION

The present invention generally relates to a dielectric material. More particularly, the present invention relates to a low dielectric constant material suitable as an insulating layer in a microelectronic integrated circuit.

BACKGROUND OF THE INVENTION

Integrated circuits often include devices formed within a semiconductor substrate and multiple levels of interconnect layers, which include conductive features separated by dielectric material. Over the years, the performance of microelectronic integrated circuits, with respect to speed and power consumption, has been improved by reducing the size of the integrated circuit, especially devices formed within the semiconductor substrate.

As the spacing between interconnect conductive features within the integrated circuit continuously decreases, the integrated circuit becomes increasingly susceptible to capacitance coupling between two or more conductive features. In particular, the integrated circuit becomes increasingly susceptible to crosstalk due to increased capacitive coupling between the conductive features and to signal propagation caused by interconnect resistailnce and capacitance ("RC delays").

The capacitance between two or more interconnect conductive features is proportional to the dielectric constant, k, of material separating the features and inversely proportional to the distance between the conductive features. Thus, adverse affects of reduced spacing between interconnect conductive features may be mitigated by interposing material having a low dielectric constant (low-κ material) between the conductive features.

Typical dielectric material used in the manufacture of integrated circuits such as silicon oxide ($SiO_x$) has a dielectric constant of about 4. However, recently, new materials having a lower dielectric constant (e.g., dielectric constants less than about 2.5) have been formed of porous silica. Generally, these porous silica films are formed by encapsulating a sacrificial material such as a polynorbornene within a silica matrix and heating the silica and sacrificial material to decompose the sacrificial material. Upon decomposition, the sacrificial material evaporates and permeates from the silica lattice, leaving air-filled voids within the lattice.

Generally, the dielectric constant of a two-phase film varies in accordance with the equation presented below:

$$\ln(k_c) = v_1 \ln(k_1) + v_2 \ln(k_2)$$

where $k_1$, $k_2$, and $k_c$ are the dielectric constant of phase 1, phase 2, and the two phase material, respectively, and $v_1$ and $v_2$ are the volume fraction of phase 1 and phase 2 in the material. Compared to dielectric film such as silica, air has a relatively low dielectric constant of 1. Thus, a dielectric constant of a two-phase material including air and silica may be reduced by incorporating more air into the two-phase material. However, as; more air is introduced into the material, the silica-based dielectric film tends to weaken and may be susceptible to damage during circuit use or subsequent circuit manufacturing processes such as chemical mechanical polishing. Accordingly, improved dielectric films having a low dielectric constant, which are suitable for microelectronic applications, are desirable.

SUMMARY OF THE INVENTION

The present invention provides an improved dielectric material and a method for forming the material. More particularly, the present invention provides a low dielectric constant material suitable as dielectric material in microelectronic integrated circuit manufacturing.

The way in which the present invention addresses the drawbacks of the now-known dielectric materials and methods of forming the materials is discussed in greater detail below. However, in general, the invention provides a porous polymer-based dielectric material that can be integrated into microelectronic interconnect manufacturing processes.

In accordance with an exemplary embodiment of the present invention, a dielectric compound is formed by dispersing a first material in a second material. In accordance with one aspect of this embodiment, the decomposition temperature of the first material is less than the glass transition temperature of the second material.

In accordance with another exemplary embodiment of the present invention, a dielectric material is formed by preparing polymer precursor solution A, dissolving a sacrificial organic material in a solvent to form a solution B, and mixing solution A with solution B to form an A-B mixture. The A-B mixture is exposed to heat to cause the solvent(s) to evaporate and to cause the polymer material to crosslink to form a solid material. The solid material is then further heated past the decomposition temperature of the sacrificial organic material to allow the organic material to evaporate. In accordance with an exemplary aspect of this embodiment of the present invention, the solid material is further heated to a temperature near or above the glass transition temperature of the polymer to form pores within the polymer. In accordance with one aspect of this embodiment, the A-B mixture solution is applied to a surface of a semiconductor wafer. In accordance with a further aspect of this embodiment, the solution is applied using spin-on or dipping techniques.

In accordance with a further exemplary embodiment of the present invention, the dielectric constant of the solid material is relatively low. Thus a relatively small pore volume is required to produce the low-κ material of the present invention. Because relatively few pores are formed within the solid material, the solid material is relatively sturdy and is suitable for subsequent water processing.

In accordance with a further exemplary embodiment of the present invention, the solid material is exposed to an oxygen containing environment during the sacrificial material decomposition process to assist liberation of the sacrificial material.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

DETAILED DESCRIPTION OF EXEMPLARY EMBODIMENTS

The present invention generally relates to a dielectric material and to a method of forming the material. The dielectric material of the present invention may suitably be used in a variety of applications such as for insulating material on printed circuit boards or other electrical apparatus However, the invention is conveniently described below in connection with dielectric films formed on or within microelectronic circuits.

The dielectric material of the present invention is formed of a two-phase material, having gas trapped within a solid. The gas phase material generally has a dielectric constant which is lower than the dielectric constant of the solid phase material. Thus, the dielectric constant of the two-phase material has a dielectric constant which is less than the dielectric constant of the solid material.

The solid material is preferably configured to withstand subsequent integrated circuit processing, such as chemical mechanical polishing and typical wafer handling. In accordance with one embodiment of the present invention, the solid material includes a polymer material. The composition of the polymer material may vary from application to application. Exemplary polymer material includes thermosetting material such as FLARE™ manufactured by Allied-Signal. PAE-2, manufactured by Shumacher, polyimide, fluorinated polyimide, poly-aromatic ethers, poly-quinoline, poly-phenylquinoline, poly-siloxanes, poly-ethylene-tetraethyorthosilicate, poly-fluoropolymers, any other polyimides, any combinations of these material, and the like.

In accordance with one embodiment of the present invention, the solid material includes a poly(arylene) ether (PAE) having a dielectric constant of about 2.6 to about 2.9 and a glass transition temperature of about 260° C. to about 450° C. The PAE material is generally ductile, and thus less friable than most silica-based films. In addition, the PAE film has a relatively low dielectric constant. Thus, relatively small gas (e.g. air) volume is required to produce a low-κ material having the same dielectric constant as porous silica. Because the dielectric material of the present invention can be formed with a relatively small gas volume, the dielectric material is relatively sturdy.

The gas phase of the dielectric two-phase material is formed by decomposing and evaporating a substance mixed with the solid material, leaving pores in the solid. In accordance with an exemplary embodiment of the present invention, the pores arc formed via organic phase separation and evaporation, as explained in greater detail below.

Figure 1:
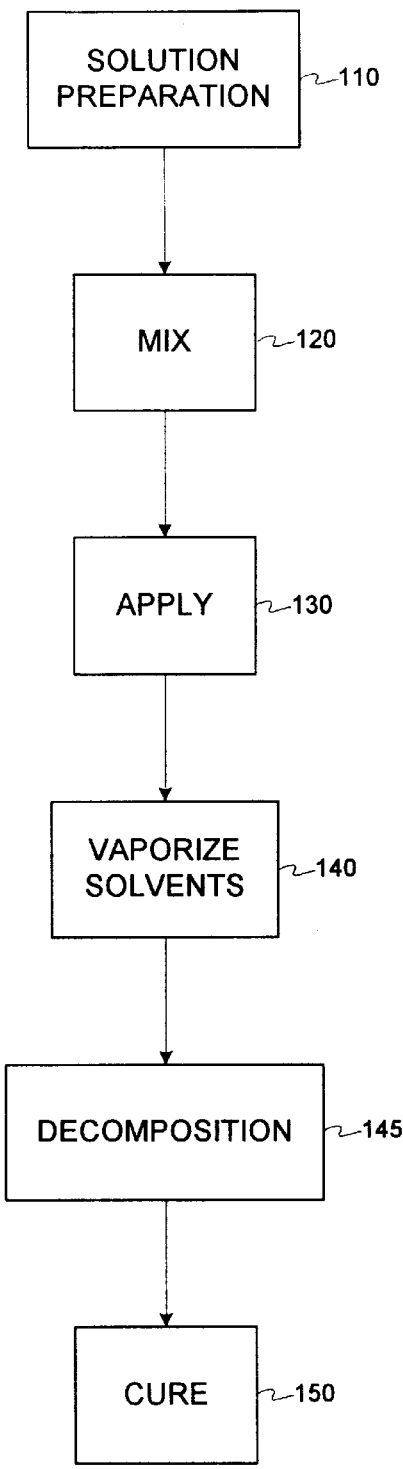
FIG. 1 is a schematic illustration of a method of forming a dielectric material in accordance with the present invention.

The two-phase dielectric material in accordance with the present invention may be manufactured according to a process 100, illustrated in FIG. 1. Process 100 suitably includes a solution preparation step 110, a mixing step 120, an application step 130, a solvent evaporation step 140, a decomposition step 145, and a cure step 150.

Preparation step 110 includes preparing solution components that, when mixed together, and submitted to the remainder of process 100, form a solid compound having gas-filled pores. In accordance with an exemplary embodiment of the present invention, preparation step 110 includes separately preparing a thermoset compound (solution A,) and a sacrificial compound (solution B).

The thermoset compound material is prepared by dissolving a thermoset precursor material (e.g., monomers) in an organic solvent. In accordance with an exemplary embodiment of the present invention, solution A is formed by mixing about 10 wt % PAE monomers with about 90 wt % cyclohexanone. However, other organic substances such as the materials described above in connection with the solid material or precursors therefore and other organic solvents may be used in connection with the present invention.

Solution B suitably includes a sacrificial organic compound that will later form a solid within and eventually evaporate from the solid phase of the dielectric material— leaving pores within the material. In accordance with an exemplary embodiment of the present invention, the organic compound is configured to mix with material in solution A and, upon vaporization of the solvents in solutions A and B, form small sacrificial solids within the thermoset material of the dielectric compound. Suitable organic compounds for solution 13 include Quickstick 135 manufactured by South Bay Technologies, rosin, abietic acid, or other organic materials which form a solid at room temperature and which can be dissolved in an organic solvent. In accordance with an exemplary embodiment of the present invention, the organic material includes abietic acid ($C_{19}H_{29}COOH$). In accordance with one aspect of this embodiment, solution B is formed by dissolving about 0.12 g/ml of abietic acid in acetone.

During mix step 120, solutions A and B are mixed together using any suitable means. In accordance with an exemplary embodiment of the present invention, solutions A and B are mixed together until the A-B mixture forms a clear, transparent substance, and A-B solution mixture is allowed to sit for one day prior to using the mixture for subsequent processing.

An amount of solution A mixed with an amount of solution B may vary in accordance with desired properties of the dielectric material, the components of solutions A and B, the concentrations of the components within solutions A and B, and other considerations. However, in accordance with an exemplary embodiment of the present invention, solutions A and B are mixed to form a solution including about 80–90 wt % solution A and about 5–20 wt % solution B.

After the A-B mixture is formed, the mixture may suitably be applied to a substrate (step 130), such as a semiconductor wafer, using any suitable means. In accordance with exemplary embodiments of the present invention, the A-B mixture is applied to a substrate using a spin-on (e.g., at a rotation speed of about 500–5000 rpm) or a dipping technique.

Next, the solvents from solutions A and B are vaporized during step 140. Step 140 includes exposing the A-B mixture to any environment that facilitates the vaporization of the solvents in the A-B mixture, while preventing decomposition of the polymer of solution A and the organic material of solution B. During step 140, the polymer material begins to polymerize—e.g., through condensation polymerization.

In accordance with an exemplary embodiment of the present invention, vaporization step 140 includes exposing the A-B mixture to a temperature of about 150° C., in an air environment for about 1 minute. During the vaporization step 140, it is thought that the sacrificial organic material from solution B separates from the polymer material, forming small (e.g., on the order of nanometers) solid organic features within the polymer.

Decomposition step 145 is suitably configured to cause the sacrificial organic material to decompose, leaving pores within the thermoset material. To this end, step 145 is configured to expose the A-B mixture to a temperature above the decomposition temperature of the organic material (to cause the organic material to decompose). In accordance with an exemplary embodiment of the present invention, step 145 includes exposing the A-B mixture to an oxygen-containing environment (e. a, air, oxygen gas, nitrogen/oxygen gas mixture) to cause the sacrificial organic material (or decomposition products thereof) to react with the oxygen to form volatile compounds such as carbon dioxide and carbon monoxide.

Cure step 150 is configured to assist pore formation in the polymer material. In particular, step 150 is configured to facilitate curing or crosslinking of the thermoset material. In accordance with an exemplary embodiment of the present invention, the condensed A-B mixture is exposed to a temperature of about 400° C., in a vacuum, nitrogen, air, or other suitable environment for about 30 minutes. In accordance with another exemplary embodiment of the invention, decomposition step 145 and cure step 150 are performed simultaneously.

Table 1, below, represents material properties for three samples containing 100 wt % solution A, 93 wt % solution A and 7 wt % solution B, and 87 w % solution A and 13 wt % solution B. As the data in Table 1 illustrates, the dielectric constant of the material (measured at 1 MHz) may be controlled by adjusting an amount of organic material and thus the amount of pores dispersed in the polymer.

TABLE 1

Measured Data for Low Dielectric Constant Polymer Films

| Sample | 1 | 2 | 3 |
|---|---|---|---|
| Wt % Solution B | 0 | 7 | 13 |
| Spin-Coat Rate | 2000 RPM | 2000 RPM | 2000 RPM |
| Dielectric Constant | 2.71 (at 1 MHZ) | 2.34 (at 1 MHZ) | 1.83 (at 1 MHZ) |
| Dissipation Factor | 0.09 (at 1 MHZ) | 0.065 (at 1 MHZ) | 0.05 (at 1 MHZ) |
| Estimated Porosity | 0% | 14% | 40% |

Figure 2:
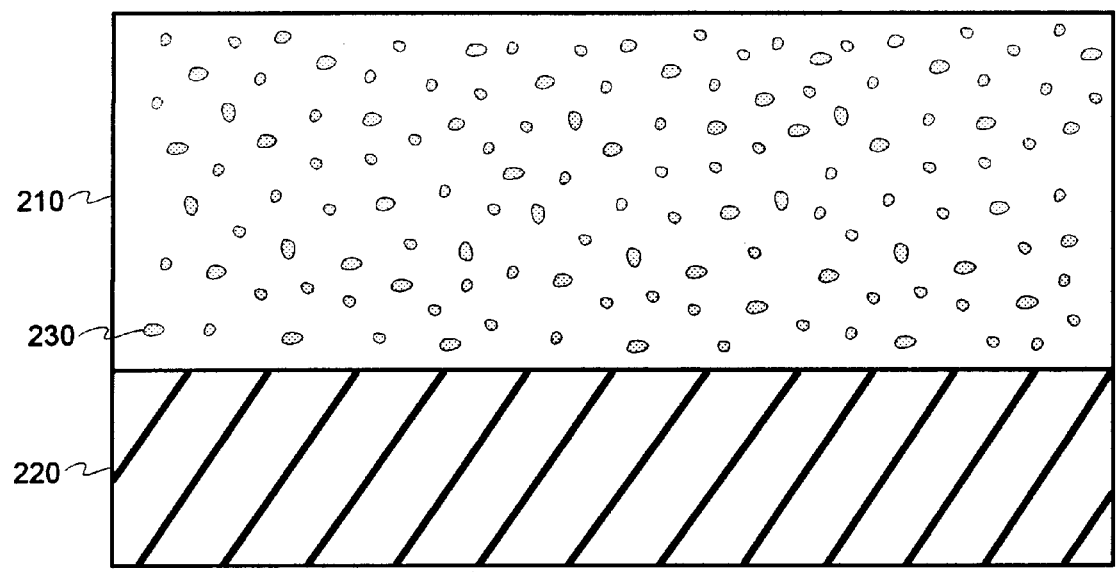
FIG. 2 is cross-sectional illustration of a porous dielectric film in accordance with the present invention.

FIG. 2 illustrates a porous polymer layer 210 deposited onto a substrate 220 (e.g., a semiconductor wafer that may include one or more insulating or conducting layers). As FIG. 2 illustrates, polymer film 210 includes pores 230 distributed throughout film 210.

A final porous dielectric film thickness may vary from application to application. However, when the dielectric material or the present invention is used to insulate interconnect conductive features, the resulting film thickness is about 0.3 $\mu$m to 2.0 $\mu$m. Also, the porosity of the film may vary from application to application, depending, at least in part, on a desired dielectric constant of the material. In accordance with an exemplary embodiment of the present invention, the material has a porosity of about 5 to 50%.

Although the present invention is set forth herein in the context of the appended drawing figures, it should be appreciated that the invention is not limited to the specific form shown. For example, while the invention is described above using a poly(arylene) ether precursor, other suitable polymer precursors may be used in connection with the present invention. Various other modifications, variations, and enhancements in the design and arrangement of the method and apparatus set forth herein, may be made without departing from the spirit and scope of the present invention as set forth in the appended claims.

We claim:

1. A method of forming a dielectric material, the method comprising the steps of:
   forming a mixture of a thermoset precursor and a dissolved sacrificial organic material;
   exposing the mixture to an environment configured to decompose the sacrificial organic material; and
   exposing a remaining mixture to an environment configured to cure the remaining mixture.

2. The method according to claim 1, further comprising the steps of:
   mixing a solvent with the thermoset precursor; and
   vaporizing the solvent.

3. The method according to claim 1, further comprising the steps of:
   mixing a solvent with the sacrificial organic material; and
   vaporizing the solvent.

4. The method according to claim 1, wherein said exposing the mixture to an environment configured to decompose the sacrificial organic material step includes placing the mixture in an oxygen containing environment.

5. The method according to claim 1, wherein said exposing the mixture to an environment configured to decompose the sacrificial organic material step and said exposing a remaining mixture to an environment configured to cure the remaining mixture step are performed simultaneously.

6. The method according to claim 1, further comprising the step of applying the mixture to a substrate.

7. The method according to claim 6, wherein said applying step includes using a spin-on process.

8. The method according to claim 1, further comprising the step of applying the mixture to a semiconductor wafer.

9. A method of forming a material suitable as a dielectric material for a microelectronic circuit, the method comprising the steps of:
   forming a first mixture of a first solvent and a thermoset precursor;
   forming a second mixture of a second solvent and a sacrificial organic material dissolved therein;
   mixing said first and second mixtures to form a liquid compound;
   applying the liquid compound to a substrate surface;
   exposing the liquid compound to a process configured to evaporate said first and second solvents to form a condensed compound;
   exposing the condensed compound to an environment configured to cause the sacrificial organic material to decompose; and
   exposing the condensed compound to an environment configured to cause said thermoset material to cure.

10. A method of forming a dielectric material, the method comprising the steps of:
    forming a mixture of a thermoset precursor and a sacrificial organic material precursor;
    exposing the mixture to an environment configured to form sacrificial organic material from the organic material precursor;
    exposing the mixture to an environment configured to decompose the sacrificial organic material; and
    exposing a remaining mixture to an environment configured to cure said remaining mixture.

11. The method according to claim 10, further comprising the steps of:
    mixing a solvent with the thermoset precursor; and
    vaporizing the solvent.

12. The method according to claim 10, further comprising the steps of:

mixing a solvent with the sacrificial organic material precursor; and vaporizing the solvent.

13. The method according to claim 10, wherein said step of exposing the mixture to an environment configured to decompose the solid sacrificial organic material includes placing the mixture in an oxygen containing environment.

14. The method according to claim 10, wherein the steps of exposing the mixture to an environment configured to decompose the solid sacrificial organic material and exposing a remaining mixture to an environment configured to cure said remaining mixture are performed simultaneously.

15. The method according to claim 10, further comprising the step of applying said mixture to a substrate.

16. The method according to claim 15, wherein the step of applying includes using a spin-on process.

17. The method according to claim 10, further comprising the step of applying said mixture to a semiconductor wafer.

18. The method according to claim 1, wherein said forming a mixture step includes providing poly(arylene) ether.

19. The method according to claim 9, wherein said forming a first mixture step includes providing poly(arylene) ether.

20. The method according to claim 10, wherein said forming a mixture step includes providing poly(arylene) ether.

* * * * *